(12) United States Patent
Gore et al.

(10) Patent No.: US 7,777,488 B2
(45) Date of Patent: Aug. 17, 2010

(54) METHODS FOR ARBITRARY SHAPE SELECTIVE EXCITATION SUMMED SPECTROSCOPY AND APPLICATIONS OF SAME

(75) Inventors: John C. Gore, Nashville, TN (US); Qin Qin, Baltimore, MD (US); Robin A. De Graaf, Hamden, CT (US)

(73) Assignee: Vanderbilt University, Nashville, TN (US)

( * ) Notice: Subject to any disclaimer, the term of this patent is extended or adjusted under 35 U.S.C. 154(b) by 46 days.

(21) Appl. No.: 12/172,706

(22) Filed: Jul. 14, 2008

(65) Prior Publication Data
US 2009/0021254 A1 Jan. 22, 2009

Related U.S. Application Data

(60) Provisional application No. 60/959,206, filed on Jul. 12, 2007.

(51) Int. Cl.
*G01V 3/00* (2006.01)
(52) U.S. Cl. .................................. 324/309; 324/307
(58) Field of Classification Search ......... 324/300–322; 600/407–435
See application file for complete search history.

(56) References Cited

U.S. PATENT DOCUMENTS

| | | | | |
|---|---|---|---|---|
| 6,489,766 | B1 * | 12/2002 | Alsop | 324/313 |
| 6,873,153 | B2 * | 3/2005 | Frydman | 324/307 |
| 7,483,732 | B2 * | 1/2009 | Zhong et al. | 600/423 |
| 7,602,184 | B2 * | 10/2009 | Du | 324/309 |
| 2003/0211036 | A1 * | 11/2003 | Degani et al. | 424/1.11 |
| 2007/0249929 | A1 * | 10/2007 | Jeong et al. | 600/410 |
| 2008/0319301 | A1 * | 12/2008 | Busse | 600/410 |

* cited by examiner

*Primary Examiner*—Brij B Shrivastav
(74) *Attorney, Agent, or Firm*—Morris, Manning & Martin LLP; Tim Tingkang Xia

(57) ABSTRACT

In another aspect, the present invention relates to a method for NMR measurements of an arbitrarily shaped region of interest of a living subject. In one embodiment, the method comprises the steps of applying a broad bandwidth of RF pulses to the arbitrarily shaped region of interest to obtain a corresponding spectrum, wherein substantially entire range of chemical shifts in the spectrum is excited from the arbitrarily shaped region of interest, interleaving a plurality of radial k-lines in radial k-space per excitation with non-selective refocusing pulses and obtaining spatial localization for the spectrum of the arbitrarily shaped region of interest.

17 Claims, 4 Drawing Sheets

METHODS FOR ARBITRARY SHAPE SELECTIVE EXCITATION SUMMED SPECTROSCOPY AND APPLICATIONS OF SAME

CROSS-REFERENCE TO RELATED PATENT APPLICATION

This application claims the benefit, pursuant to 35 U.S.C. §119(e), of provisional U.S. Patent Application Ser. No. 60/959,206, filed Jul. 12, 2007 entitled "2D Arbitrary Shape Selective Excitation Summed Spectroscopy and Applications of the Same" by Qin Qin, John C. Gore, and Robin A. DeGraaf, the disclosure for which is hereby incorporated herein in its entirety by reference.

Some references, which may include patents, patent applications and various publications, are listed and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "(n)" represents the nth reference cited in the reference list. For example, (6) represents the 6th reference cited in the reference list, namely, Pauly J, Nishimura D, Macovski A. A k-space analysis of small-tip-angle excitation. J Magn Reson 1989; 81(1):43-56.

FIELD OF THE INVENTION

The present invention generally relates to system and methods of measuring of magnetic resonant spectra from target regions with arbitrary shape and applications of same.

BACKGROUND OF THE INVENTION

In vivo MR spectroscopy (MRS) provides considerable information about biochemical processes and metabolic status relevant for biological research and clinical diagnosis. However, since metabolism can vary greatly between different tissue types, it is essential to minimize partial volume effects in the observed NMR signal. This is typically achieved through the use of well-defined spatial localization.

Two groups of spatial localization techniques have been extensively developed for in vivo MRS applications: single-voxel localization and spectroscopic imaging (MRSI). Single-voxel localization techniques use frequency selective RF pulses in combination with constant amplitude gradients to define a small rectangular cube as a region-of-interest (ROI). Popular methods include image-selected in vivo spectroscopy (ISIS) (1), stimulated echo acquisition mode (STEAM) (2), and point-resolved spectroscopy (PRESS) (3). MRSI techniques (4) use phase encoding gradients to encode spatial information.

Signal sensitivity and spatial specificity are two competing factors in both groups of spatial localization techniques. While the localized volume would ideally be large to achieve high signal-to-noise ratio (SNR) at high temporal resolution, the cubic size would typically lead to inclusion of several different tissue types. This so-called partial volume effect complicates interpretation of spectroscopic information, as tissues with different metabolic profiles and status contribute to the signal. This is especially true when dealing with diseased tissues with diffuse abnormalities, as for example encountered in epilepsy (5), but even differentiating metabolism in cerebral or cerebellar gray and white matter is complicated by partial volume effects inherent to conventional (cubic) localization methods. Averaging NROI MRSI pixels over a given ROI will lead to a $(N_{ROI})^{1/2}$ penalty in SNR per unit of time compared to a spectrum directly acquired from the ROI.

Therefore, a heretofore unaddressed need still exists in the art to address the aforementioned deficiencies and inadequacies.

SUMMARY OF THE INVENTION

In one aspect, the present invention relates to a method for NMR measurements of an arbitrarily shaped region of interest of a living subject. In one embodiment, the method comprises the steps of applying a broad bandwidth of RF pulses to the arbitrarily shaped region of interest to obtain a corresponding spectrum, wherein substantially entire range of chemical shifts in the spectrum is excited from the arbitrarily shaped region of interest, interleaving a plurality of radial k-lines in radial k-space per excitation with non-selective refocusing pulses and obtaining spatial localization for the spectrum of the arbitrarily shaped region of interest.

In another aspect, the present invention relates to a system for NMR measurements of an arbitrarily shaped region of interest of a living subject. In one embodiment, the system has means for applying a broad bandwidth of RF pulses to the arbitrarily shaped region of interest to obtain a corresponding spectrum, wherein substantially entire range of chemical shifts in the spectrum is excited from the arbitrarily shaped region of interest. The system also has means for interleaving a plurality of radial k-lines in radial k-space per excitation with non-selective refocusing pulses, and means for obtaining spatial localization for the spectrum of the arbitrarily shaped region of interest. The system further has means for generating a broad bandwidth of RF pulses.

These and other aspects of the present invention will become apparent from the following description of the preferred embodiment taken in conjunction with the following drawings, although variations and modifications therein may be affected without departing from the spirit and scope of the novel concepts of the disclosure.

DETAILED DESCRIPTION OF THE INVENTION

Figure 1:
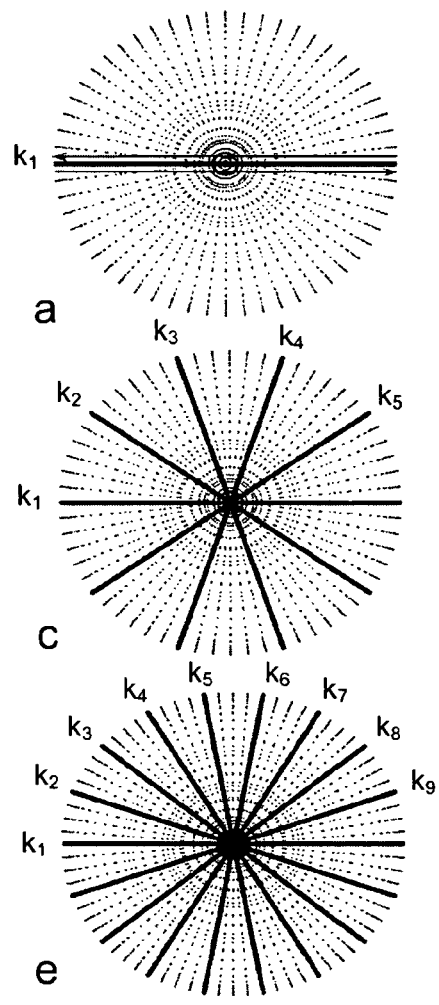
FIG. 1 illustrates several embodiments of the present invention in k-space for different sets of parameters: $N_{k-line}$=1: (a) Radial k-space trajectory; (b) Corresponding RF pulses (solid line, B1x; dashed line, B1y) and accompanying gradients (solid line, $G_x$; dashed line, $G_y$, double dashed line, $G_z$); $N_{k-line}$=5: (c) Radial k-space trajectory; (d) RF pulses and gradients, the phases of 4 refocusing pulses are alternated as ++−−; $N_{k-line}$=9: (e) Radial k-space trajectory; (f) RF pulses and gradients, the phases of 8 refocusing pulses are alternated as +−−+−−+, respectively.
Figure 1:
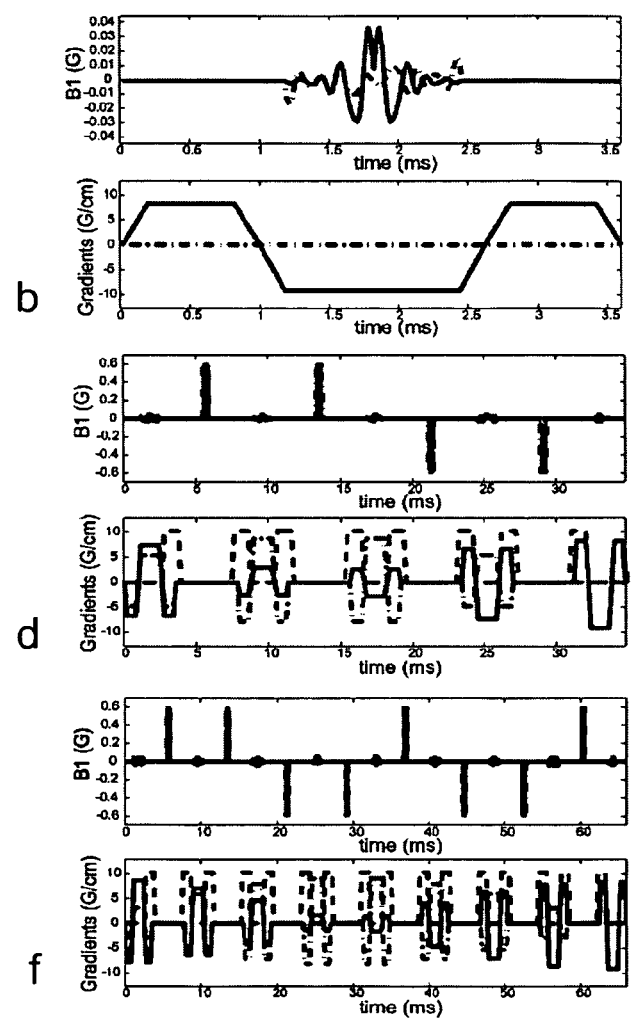

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Additionally, certain theories are proposed and disclosed herein; however, in no way they, whether they are right or wrong, should limit the scope of the invention. Furthermore, titles or subtitles may be used in the specification for the convenience of a reader, which shall have no influence on the scope of the present invention.

The description will be made as to the embodiments of the present invention in conjunction with the accompanying drawings of FIGS. 1-4. In accordance with the purposes of this invention, as embodied and broadly described herein, this invention relates to system and methods of measuring of MR spectra from target ROI with arbitrary shape and applications of the same.

Spatial localization with multidimensional spatially selective RF pulses (6-9) offers a potential solution to the problems set forth above, as these pulses can in principle be tailored to excite any arbitrarily shaped ROI. Among other things, one aspect of the present invention relates to the utilization of a plurality of multi-dimensional RF pulses to select any arbitrarily shaped ROI with a high spectral bandwidth.

Among other unique features, the present invention provides, for the first time, a method utilizing a plurality of multi-dimensional RF pulses to select any arbitrarily shaped ROI with a high spectral bandwidth. This method is termed as "Arbitrary Shape Selective Excitation Summed Spectroscopy" ("ASSESS"). ASSESS utilizes interleaved radial k-space trajectories scanned by different numbers of radial k-lines per excitation. The construction and characteristics of ASSESS using 1, 5 and 9 radial k-lines per excitation are specifically explored and set forth in this disclosure. Other radial k-lines can also be utilized to practice the present invention. By both imaging and spectroscopy of rat brain ROIs, in vivo results show the feasibility and utility of this approach for localized ¹H NMR spectroscopy.

Thus, in one aspect, the present invention relates to a method for NMR measurements of an arbitrarily shaped region of interest of a living subject. In one embodiment, the method comprises the steps of applying a broad bandwidth of RF pulses to the arbitrarily shaped region of interest to obtain a corresponding spectrum, wherein substantially entire range of chemical shifts in the spectrum is excited from the arbitrarily shaped region of interest, interleaving a plurality of radial k-lines in radial k-space per excitation with non-selective refocusing pulses and obtaining spatial localization for the spectrum of the arbitrarily shaped region of interest.

In another aspect, the present invention relates to a system for NMR measurements of an arbitrarily shaped region of interest of a living subject. In one embodiment, the system has means for applying a broad bandwidth of RF pulses to the arbitrarily shaped region of interest to obtain a corresponding spectrum, wherein substantially entire range of chemical shifts in the spectrum is excited from the arbitrarily shaped region of interest. The system also has means for interleaving a plurality of radial k-lines in radial k-space per excitation with non-selective refocusing pulses, and means for obtaining spatial localization for the spectrum of the arbitrarily shaped region of interest. The system further has means for generating a broad bandwidth of RF pulses.

In yet another aspect, the present invention relates to a method for NMR measurements of an arbitrarily shaped region of interest of a living subject. In one embodiment, the method comprises the steps of applying RF pulses with a bandwidth to the arbitrarily shaped region of interest to obtain a corresponding spectrum with one or more excitations, interleaving a plurality of radial k-lines in radial k-space per excitation with one or more non-selective refocusing pulses; and obtaining spatial localization for the spectrum of the arbitrarily shaped region of interest. The bandwidth of the RF pulses is sufficiently broad to allow a substantially entire range of chemical shifts in the spectrum to be excited from the arbitrarily shaped region of interest.

The plurality of radial k-lines in radial k-space has a total number $N_{k-line}$. The total number $N_{k-line}$ is an odd number. In certain embodiments, the total number $N_{k-line}$=1, 5 or 9.

The arbitrarily shaped region of interest can be two dimensional or three dimensional.

The frequency of RF pulses can be in a range of 10 Hz-100 GHz.

EXAMPLES OF THE INVENTION

Without intent to limit the scope of the invention, additional exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as data are processed, sampled, converted, or the like according to the invention without regard for any particular theory or scheme of action.

Radial Trajectory in K-Space

The desired excitation profile Mxy (x,y)=M sin(θ(x,y)) is chosen as a N×N matrix with resolution Δx=FOE/N, where FOE represents the field of excitation. Based on the k-space formalism of spatially selective excitation (6,7), the nutation-angle profile is the Fourier transform (FT) of the applied RF pulses, which weight the excitation along a k-space trajectory defined by the simultaneously modulated gradients. In a discrete form this Fourier pair is given by, $$\theta(x, y) = \sum_{m=1}^{M} [\gamma B_1(m)\Delta t]\exp[i(xk_x(m) + yk_y(m))] \quad [1]$$

$$k_{x,y}(m) = -\sum_{s=m}^{M} [\gamma G_{x,y}(s)\Delta t] \quad [2]$$

The piece-wise RF construction assumes that the RF pulses are composed of a series of M individual hard pulses with complex amplitudes $$B_1(m)=B_{1x}(m)+iB_{1y}(m), m=\{1, 2 \ldots M\}$$

and duration Δt.

For MR imaging the implementation of Eq. [1][2] has resulted in many useful applications, such as navigator pulses (10), restricted FOV imaging (11), curved slice imaging (12), functional MRI susceptibility artifacts reduction (13), flow velocity imaging (14) and perfusion territory mapping (15). However, for MR spectroscopy an additional consideration appears in terms of required spectral bandwidth of the RF pulse. Ideally, the whole range of chemical shifts in the spectrum needs to be excited from the same ROI. In analogy with the acquisition stage, the accumulated phase caused by chemical shifts during multi-dimensional excitation is manifested as blurring in a spiral trajectory (16) and a shift along the phase encoding direction in an echo-planar trajectory (17). Although shortening the overall pulse duration will reduce the blurring/shift, it puts unrealistic demands on the gradient and RF systems. Dividing the k-space trajectory into Ni interleaved sub-pulses increases the bandwidth in principle $N_i$ times. For the spectroscopic acquisitions from arbitrary shapes at high magnetic fields, the radial trajectory was found to have a broad bandwidth and low demand on RF peak power $B_{1\_max}$ (18).

FIGS. 1a, 1c, and 1e depict the foundation block of the radial k-space trajectory used by ASSESS for different k-lines in k-space, respectively. During each excitation, one k-line through the center of k-space is scanned at one rotational angle. FIGS. 1b, 1d and 1f show the weighted RF pulses (top), and the corresponding gradients of x and y channels (bottom) corresponding to FIGS. 1a, 1c, and 1e, respectively. The initial gradient lobe brings the k-space trajectory from the origin to kmin=−π/Δx. The second gradient lobe starts from kmin, scans through the origin, and reaches to kmax=π/Δx. The k-space trajectory is brought back to the origin by the third gradient lobe.

The RF pulses are constructed in a similar way as proposed by Hardy and Cline_(8). For the generated radial trajectory, the accompanying RF pulses, weighted only during the second gradient lobe, are calculated using a superposition of the FT of point delta functions of all the different points within the ROI $$(x_{n_{ROI}}, y_{n_{ROI}}) \cdot n_{ROI} = \{1, 2 \ldots N_{ROI}\}. \quad [3]$$

$$B_1(m) = S \sum_{n_{ROI}=1}^{N_{ROI}} \exp\left[-i\left(\begin{array}{c}(x_{n_{ROI}} - x_c)k_x(m) + \\ (y_{n_{ROI}} - y_c)k_y(m)\end{array}\right)\right] \times \left(\frac{\sqrt{k_x(m)^2 + k_y(m)^2}}{k_{max}}\right)$$

$(x_c, y_c)$ is the position of the center of the excitation profile matrix. The RF pulses are compensated by the inverse of the sample density of the corresponding k-space location, indicated by the factor at the end of Eq. [3](19). The scale factor, S, determines the desired nutation angle. For the trajectory shown in FIG. 1a, ASSESS can only produce a small nutation angle θ≈10°, with $$M_z=M_0 \cos(\theta) \approx M_0$$

as required by this linear Fourier (Eq. [1] [3]) approximation of the nonlinear Bloch equations (6).

The sample number along each k-line is N and the minimum number of total radial klines (Nθ) needed to remove aliasing out of the FOE is $N_\theta = N \times \pi/2$. Due to the very short duration N×Δt when the RF pulse is on, the introduced phase by the different chemical shifts is similar to that during standard slice selective pulses. In fact, each excitation just excites a profile defined by the 1DFT of applied RF pulse along the same radial direction specified by $G_x/G_y$ pair and back projected to 2D. All of the excitation results successively obtained with $N_i=N_\theta$ radial directions are summed up to produce the desired 2D excitation profile. Because of the rotational symmetry of the k-space coverage of a radial trajectory, the excitation profile will be blurred by the chemical shift off resonance and the extent of the blurring is the same for positive and negative off-resonance conditions. Hence it is wise to have the ASSESS pulses on resonance at the center of the desired spectral frequencies to maximize the achievable bandwidth.

Concatenation

ASSESS with a single radial k-line per excitation ($N_{k-line}=1$) and $N_i=N_\theta$ interleaved excitations as described above achieves a broad bandwidth at the cost of a low nutation angle. Large nutation angle selective excitation can be synthesized through a concatenation of a series of small excitation pulses with the same rotation axis (7). Multiple radial k-lines per excitationn ($N_{k-line}>1$) and $N_i=N_\theta/N_{k-line}$ interleaved excitations covers the same k-space (FIG. 1a: $N_{k-line}=1$, only one k-line, $k_1$; FIG. 1c: $N_{k-line}=5$, five k-line, $k_1, k_2, k_3, k_4$, and $k_5$; FIG. 1e: $N_{k-line}=9$, nine k-line, $k_1, k_2, k_3, k_4, k_5, k_6, k_7, k_8$, and $k_9$); yet by linearly adding the rotation about the same axis, they each achieve higher nutation angle θ≈50° and θ≈90°. The overall Excitation Pulse Length EPL is also increased $N_{k-line}$ times.

Bandwidth Broadening

The bandwidth of these pulses with multiple radial k-lines per excitation degrades quickly with the prolonged EPL, which is unacceptable for spectroscopy measurements. To increase the bandwidth, a long RF pulse can be divided into several shorter segments and interleaved with non-selective 180° refocusing pulses (FIG. 1d and FIG. 1f). Wright et al. (20) demonstrated this approach on a 2D inversion pulse. It was also used in the design of short $T_2$-selective imaging (21). RARE imaging (22) is the counterpart of this method to broaden the bandwidth in acquisition k-space.

For ASSESS ($N_{k-line}>1$), it is natural to put 180° refocusing pulses between each radial k-line excitation. In order to minimize the sensitivity to inhomogeneity of static field $B_0$ and radiofrequency field $B_1$, $90°_y 180°_x 90°_y$ composite pulses are used for non-selective refocusing. Paired GZ crusher gradients surrounding each refocusing pulse are critical to remove the unwanted signals excited by the non-selective refocusing pulses.

Note that care must also be taken in the selection of the non-selective refocusing pulses, as the overall bandwidth of the ASSESS pulse may become limited by their bandwidth.

Pulse Calculation and Numerical Simulation

A 2D arbitrary shape selective excitation GUI (Graphical User Interface) was built in MATLAB 7.0 (MathWorks, Inc., Natick, Mass., USA). After loading a scout image, a FOE is defined to efficiently cover the desired excitation profile; then the ROI is manually traced out within the smaller matrix N×N but with the same resolution as the scout image. ($x_c$, $y_c$) of the defined excitation profile matrix is used to modulate the phase of the calculated RF pulses as described above. The generated RF pulses and gradients can be directly used on the MR system or alternatively may be imported into a Bloch equation simulator to verify the performance. The simulator is written in MEX script with the C programming language. It computes the rotation matrix of the vector sum of $$B_{1x/y}(m) \text{ and } G_{x,y}(m)$$

at each interval $\Delta t$ of the pulse and ignores longitudinal relaxation.

A simulation of the effect of an average transverse relaxation time of 180 ms upon the excitation found that the effective decay time $TE_{eff}$ for all ASSESS pulses can be approximated as EPL/2.

Pulse Sequence

Figure 2:
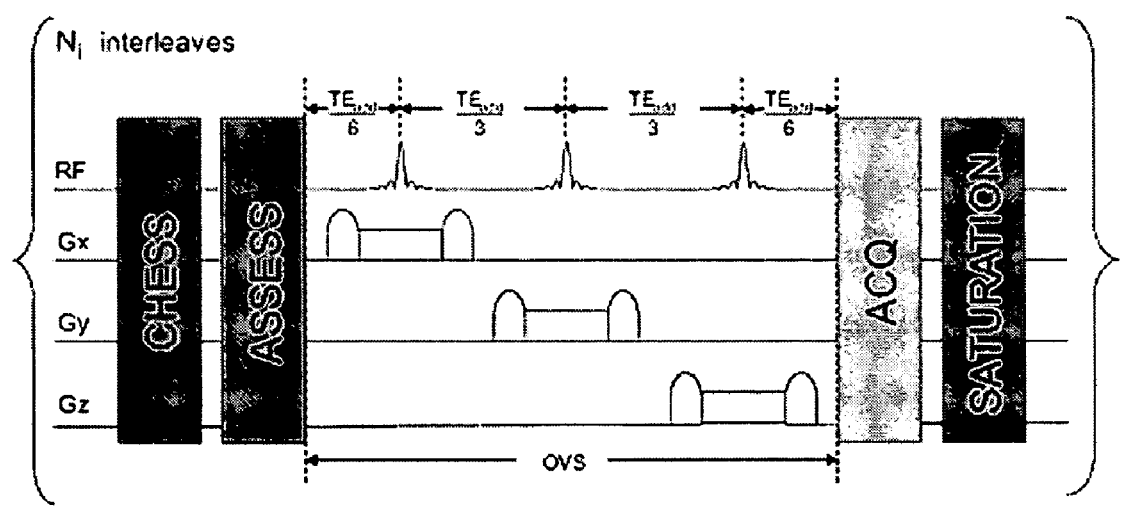
FIG. 2: Pulse sequence diagram with excitation for spectroscopy measurement according to one embodiment of the present invention. Each interleave consists of 5 blocks, CHESS water suppression, ASSESS excitation, OVS, acquisition, and saturation. The delay time between the middle of the ASSESS pulse and the middle of the first refocusing pulse in OVS needs to be $TE_{add}/6$; delay time between the three refocusing pulses in OVS should be $TE_{add}/3$; delay time between the middle of the last refocusing pulse in OVS and the echo at acquisition is $TE_{add}/6$ as well. Hereafter the overall echo time TE is $TE_{eff}+TE_{add}=EPL/2+TE_{add}$. Only ASSESS block applies different pulses to rotationally cover the full k-space between each interleave. All the other blocks are kept the same before a full set of interleaves end.

FIG. 2 shows the pulse sequence diagram using ASSESS excitation pulses for all imaging and spectroscopy measurements. Following CHESS water suppression (23), ASSESS pulses excite all of the metabolites from the selected ROI. Most areas outside the ROI are not excited. However, excitation of unwanted signals may be caused by aliasing from outside the FOE, imperfect k-space sampling within the FOE, and insufficient crushing due to $B_0$ and $B_1$ field inhomogeneity. To minimize this contamination artifact, ASSESS is followed subsequently by three slice-selective 180° pulses (optimized sinc180 (24)). Two pulses are used to suppress all unwanted signal outside a rectangular box encompassing the complete arbitrary excitation profile. The third 180° pulse is used for through-plane slice selection. An echo time $TE_{add}$ of OVS is added to $TE_{eff}$ of the excitation pulse to form a spin echo with an over all echo time TE at the start of acquisition.

Images of ROI localization are acquired using a conventional 2DFT MRI sequence with the echo in the middle of the acquisition window. Spectroscopy acquisition starts right after the formed spin echo.

Post-acquisition saturation is added because the longitudinal magnetization is different after each excitation along different radial k-lines. In order to prevent incomplete cancellation of unwanted signals, a 2 ms adiabatic half passage pulse with 1000 Hz maximum $B_1$ amplitude ($B_{1\_max}$) is applied immediately after acquisition to flip all spins left along the longitudinal direction to the transverse plane, after which they are being dephased by the following gradient.

In Vivo Experiments

All experiments were performed on a 4.0 T/31 cm bore magnet (Bruker Instruments, Billerica, Mass., USA). The system is equipped with a 15 cm diameter Bruker gradient set capable of switching 13 G/cm in 170 μs. A volume coil transmit/surface coil receive (peak power 3500 Hz) combination was utilized to generate a relative homogeneous transmitting RF field while simultaneously maximizing the sensitivity of the received signal.

High quality spectroscopy relies on uniform $B_0$ homogeneity across the entire (arbitrarily-shaped) ROI. Manual iterative shimming is time consuming, tedious and prone to incorrect shim settings due to the many local minima. Automated techniques like FASTMAP (25) are efficient but only effective for cube-shaped ROIs. Here field mapping is required in order to generate a homogeneous $B_0$ field within the arbitrarily shaped ROI. Multi-slice gradient echo images (FOV=25.6 mm, matrix size=64×64, 4 adjacent slices with slice thickness=0.5 mm, TR=0.5 sec) were acquired with 5 evolution delays ([5, 6 7, 9, 13] ms) so that the field maps can be calculated with a temporal phase unwrapping algorithm.

Axial scout images of rat brain were obtained from a multislice RARE sequence (echo train length ETL=8, echo spacing 15 ms, TE=60 ms, matrix size=128×128, FOV=25.6 mm, slice thickness=1 mm, pulse repetition time (TR)=3 sec, number of averages (NEX)=8)

In order to validate the feasibility of different ASSESS pulses, a 9×3×3 $mm_3$ rectangular shaped ROI in the frontal area of the rat brain was chosen from the scout image, and excited by all three ASSESS pulses ($N_{k-line}$=1, 5, 9) in addition to a conventional PRESS localization method for comparison. The 9×3=27 $mm^2$ ROI in the axial plain was defined from a 64×64 matrix of excitation profile with FOE=12.8 mm. RF pulses and gradients of ASSESS were generated with step duration_t=20 μs. The maximum gradient strength required was 9.2 G/cm.

ASSESS ($N_{k-line}$=1) pulses had the pulse length EPL=3.6 ms with 64×0.02=1.28 ms during which the RF pulses were on (FIG. 1b). After $N_i=N_\theta=64\times\pi/2\approx100$ interleaves, the selected ROI was excited at $\theta\approx10°$ to avoid significant non-linearity during excitation.

For ASSESS ($N_{k-line}$=5, 9), 400 μs $90°_y 180°_x 90°_y$ composite pulses were inserted between different segments. Pairs of 1 ms crusher gradients employing 80% of maximum gradient strength (10.2 G/cm) surrounded each refocusing pulse with additional 1 ms delays to minimize eddy current effects.

The pulse length of ASSESS ($N_{k-line}$=5) was lengthened to be EPL=34.8 ms (FIG. 1d), reducing the required number of interleaves to $N_i=N_\theta/N_{k-line}\approx20$. The nutation angle of the selected ROI was increased up to about $\theta\approx50°$.

ASSESS ($N_{k-line}$=9) required further lengthening of EPL to be 66 ms ($TE_{eff}$=33 ms) (FIG. 1f). The number of interleaves was reduced to be $N_i=N_\theta/N_{k-line}\approx12$. The nutation angle of the selected ROI was hence brought up to about $\theta\approx90°$.

The OVS pulses after ASSESS suppressed anything outside a volume of 12×4×3 $mm^3$, which in the axial plane was slightly larger than the ROI and in the third dimension localized a 3 mm slice. For all interleaved images acquired (number of phase encoding steps=128, FOV=25.6 mm), the echo time TE=$TE_{eff}$+$TE_{add}$ was kept at 67 ms and TR=500 ms with NEX=1; For all interleaved spectroscopy acquisitions (SW=2.5 kHz, 1024 complex points), the echo time TE=$TE_{eff}$+$TE_{add}$ was kept at 144 ms and TR=3000 ms with NEX$\approx$288/$N_i$, which took about 14 min to obtain each summed ASSESS result.

To validate and compare the results, the ASSESS excitation pulse (FIG. 2) was replaced by a 2 ms adiabatic half passage pulse (the same as used for saturation) to rotate all the spins to the transverse plane. The 9×3×3 $mm^3$ ROI was localized by the following OVS pulses. This is similar to a PRESS localization sequence. The single 2DFT image acquisition was acquired with TE=67 ms and TR=500 ms with NEX=1. Spectra were still obtained at TE=144 ms and TR=3000 ms with NEX=288.

A second ROI, with two discontinuous, convolved regions in the axial plane (2 mm thick slice) (10.3×2 mm$^3$) within the hippocampus, was chosen to demonstrate the advantage of ASSESS over other conventional pulses (1-3) in selecting complexed shapes for spectroscopic measurements. Only ASSESS ($N_{k-line}$=9) was used in this second experiment. FOE and OVS were kept the same with those of the first experiment except a slight difference in ($x_c$, $y_c$). $N_i$=12 interleaved 2DFT images were acquired with ASSESS both on resonance and 600 Hz off resonance during excitation. Spectroscopic acquisitions were performed for about 14 minutes ($N_i$=12, NEX=24, TR=3000 ms) and then repeated six times to achieve sufficient SNR. The six separately stored FIDs were frequency corrected before addition to correct for magnetic field drift.

Results

Figure 3:
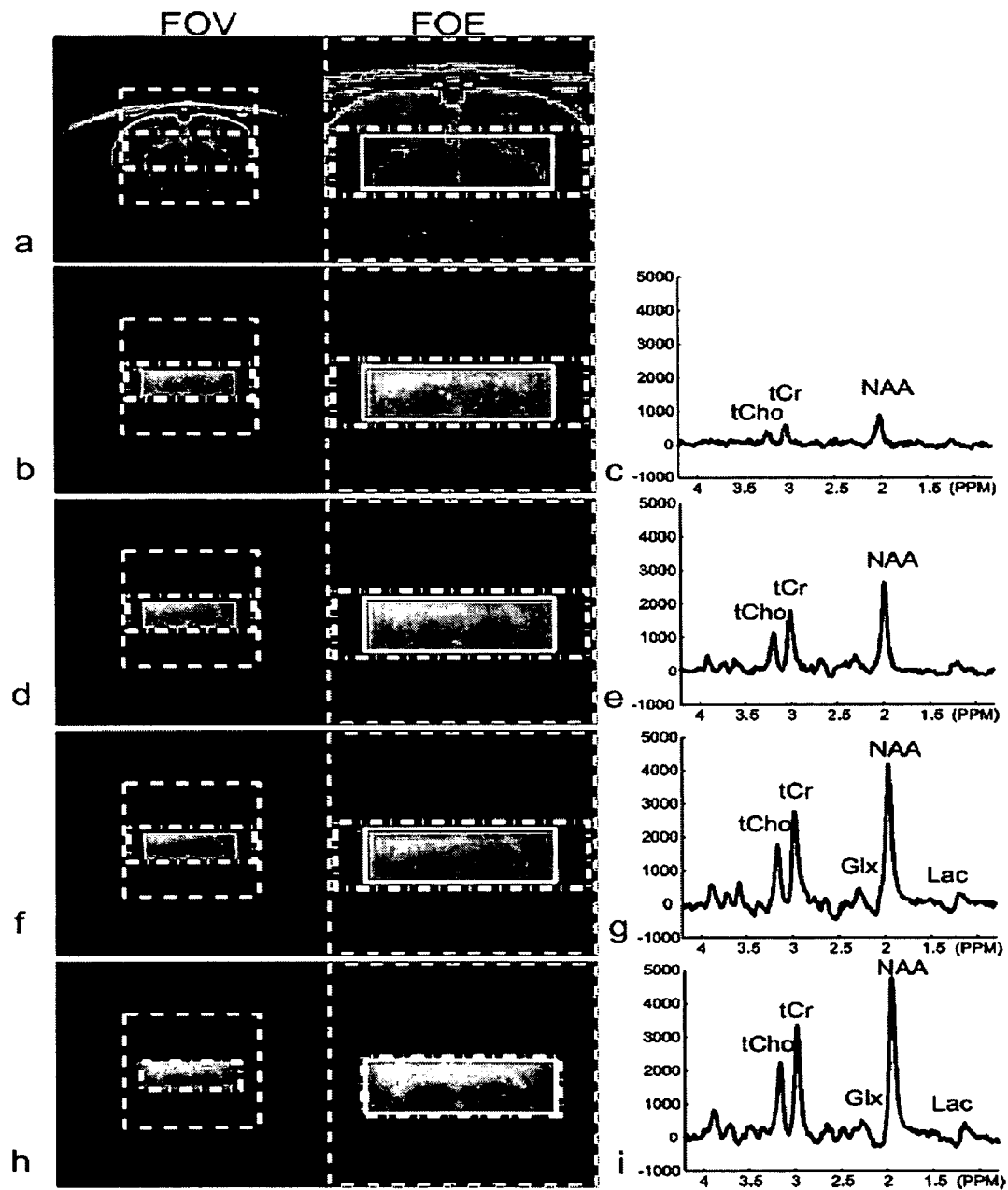
FIG. 3 shows the results of practicing the present invention in connection with a rectangular ROI (9×3×3 mm³), where the dashed square line, the dash dot rectangular line, and the solid line each indicate the defined FOE, OVS and selected ROI, respectively: (a) scout image from RARE (128×128, FOV=25.6 mm: left; zoomed out 64×64, FOE=12.8 mm: right); ASSESS ($N_{k-line}$=1) with Ni=100; (b) summed image of localization; (c) summed spectroscopy with NEX=3; ASSESS ($N_{k-line}$=5) with Ni=20 (d) summed image of localization; (e) summed spectroscopy with NEX=14; ASSESS ($N_{k-line}$=9) with Ni=12 (f) summed image of localization; (g) summed spectroscopy with NEX=24; and the results of ASSESS are compared with PRESS (h) image of localization and (i) spectroscopy with NEX=288, respectively.
Figure 4:
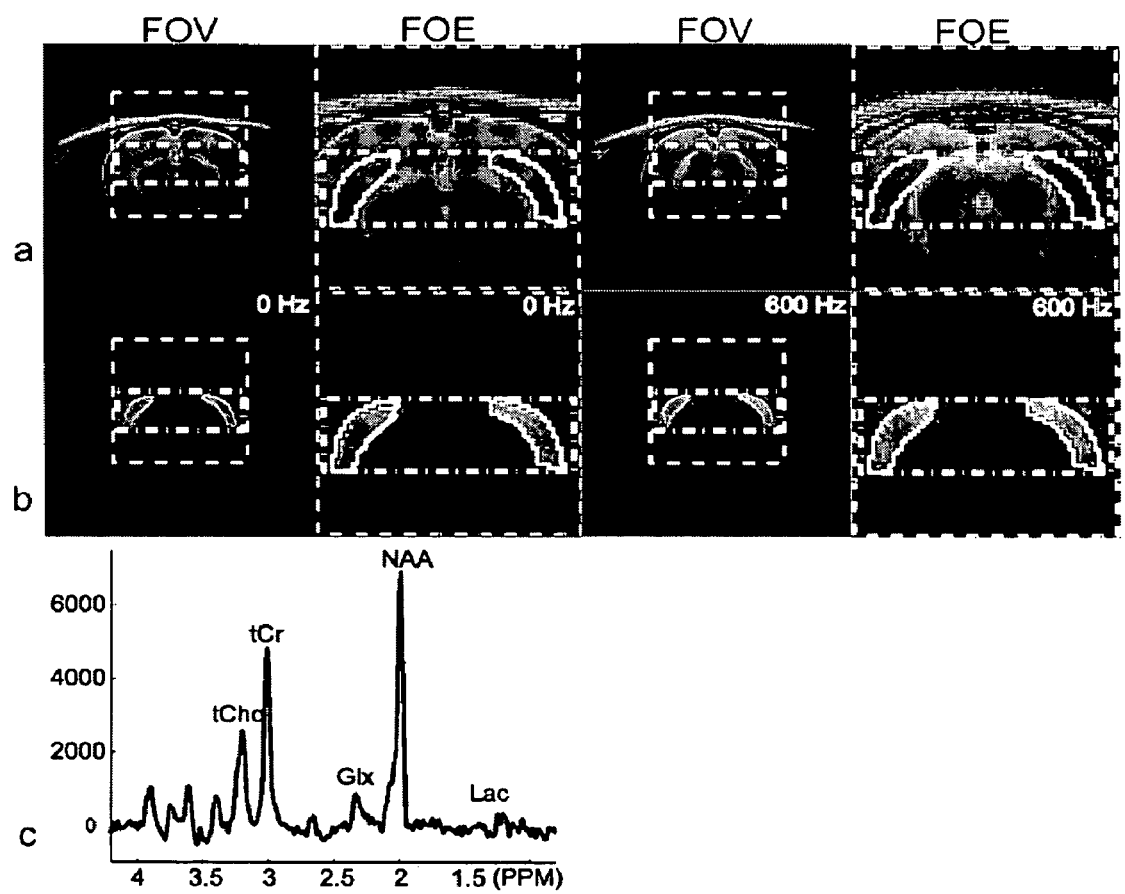
FIG. 4 shows results of measuring spectroscopy of a discontinuous, convolved ROI (10.3×2=20.6 μL) from the hippocampus area: (a) Scout images of two adjacent slices each with 1 mm thickness. The ROI is circled by the solid lines within the FOE (dash line) and OVS (dash dot line); ASSESS ($N_{k-line}$=9) with $N_i$=12; (b) summed images with both on resonance and 600 Hz off resonance at excitation; and (c) summed spectroscopy of 6 sequential groups each with NEX=24.

The imaging and spectroscopy results from the rectangular shaped ROI are shown and compared in FIG. 3. The original scout image of a rat brain (FIG. 3a) has matrix size 128×128 with FOV=25.6 mm and shows the ROI (solid line) within the excitation profile 64×64 with FOE=12.8 mm (dashed line). The dash dot line indicates the OVS (12×4×3 mm$^3$) volume.

For respective ASSESS experiments of the rectangular ROI, the images and spectra of $N_i$ interleaves were summed up and the results are shown in FIG. 3 (b and c, $N_{k-line}$=1; d and e, $N_{kline}$=5; f and g, $N_{k-line}$=9). FIGS. 3h and 3i show the results of the PRESS like sequence as standard for comparison.

The spectra shown in FIG. 3 (c: ASSESS ($N_{k-line}$=1); e: ASSESS ($N_{k-line}$=5); g: ASSESS ($N_{k-line}$=9); I: PRESS) were all collected from the same ROI, with the same receiver gain and acquisition parameters and total acquisition duration (14 min). With ASSESS ($N_{k-line}$=1), only three dominant metabolites, total choline (tCho), total creatine (tCr) and N-acetyl aspartate (NAA) are visible in the spectrum. Other resonances from glutamate and glutamine (Glx) and lactate (Lac) start to show in the spectrum with ASSESS ($N_{k-line}$=5). With more k-lines concatenated in each excitation, ASSESS ($N_{k-line}$=9) generated a SNR close to that of the standard PRESS like sequence. The difference in intensities of the major metabolite peaks (tCho, tCr, NAA) are a reflection of a number of factors. Most dominantly, the increase of nutation angles (10°, 50°, 90°, and 90°) leads to an increase in the detected signal, i.e. sin(θ)=(17%, 77%, 100%, 100%). Also, the lengthening of ASSESS pulses is accompanied by more paired crushing gradients surrounding the added refocusing pulses, which contributes more diffusion weighting to the signals. Thirdly, when comparing the edges of ROIs generated by ASSESS (FIG. 3b, d, f: FOE) and PRESS (FIG. 3h), PRESS actually excited a slightly larger area than the desired ROI because of imperfect slice profiles of the OVS pulses.

In order to illustrate the capability of ASSESS in obtaining spectroscopic measurements from arbitrarily-shaped ROIs, a more complicated ROI (total volume=10.3×2=20.6 μL) which closely follows the hippocampal areas was outlined. FIG. 4a shows the scout images of two adjacent slices each with 1 mm thickness. The ROI is indicated by the solid lines within the FOE (dash lines) and OVS (dash dot lines) volumes. Despite the relatively large volume, partial volume effects are minimal as the selected ROI holds >90% hippocampal gray matter.

For ASSESS with $N_{k-line}$=9, $N_i$=12 interleaved images were obtained both on resonance and 600 Hz off resonance during excitation. The summed images are shown in FIG. 4b. The broad bandwidth of ASSESS is demonstrated by the intact localization within the targeted ROI even at 600 Hz off resonance.

FIG. 4c shows the field-drift corrected and summed spectrum from 6 groups of sequentially saved spectra each taken 14 min, all from the indicated hippocampal ROI.

Discussion

The above disclosure demonstrated the utility of 2D excitation pulses for $^1$H NMR spectroscopy applications using arbitrarily shaped ROIs according to the present invention. Despite the long pulse lengths, excellent spectral bandwidths could be obtained by combining the 2D ASSESS pulses with non-selective refocusing pulses. The invented ASSESS pulses as described in this work have demonstrated a novel approach or MR spectroscopy from arbitrarily-shaped ROIs. While conventional (rectangular) localization has been firmly established, it is often compromised by severe partial volume effects as in vivo tissues typically deviate from rectangular shapes. Choosing the entire tissue or any desired arbitrary shape as a ROI, the attainable SNR of the spectra is increased in proportion to the volume excited. With the described approach, partial volume effects are minimized and SNR is optimized by acquiring signal from an anatomically determined ROI. It would also be of interest to identify regions for measurements based on other applications, such as activated areas in fMRI studies and contrast enhanced areas in molecular imaging studies. The method can also be practiced to excite 3D arbitrary shape ROI, although it was demonstrated in 2D in this disclosure only for the benefit of readers.

Other choices of excitation k-space trajectory for MRS measurement have been explored. Hardy et al. (9) used a multi-shot spiral trajectory (2-cycle 8-arm Pinwheel) to excite a cylindrical shape and achieved 12 ppm bandwidth for phosphorus ($^{31}$P) spectrum at 1.5 T. More complicated shapes are difficult to be excited with broad bandwidth because the required spiral trajectory can not be broken up to less than 1 cycle for each sub-pulse. Also for $^{31}$P NMR, Rim et al. (26) employed radial gradient coil to make 64 self-refocused radial scanning loci to excite a rectangular volume with 12 ppm bandwidth at 2T. Radial gradient coils are not standard tools on most MRI scanners, which prevent this method to be more widely used. An interleaved rectilinear trajectory proposed by Panych et al. (27) was used for spectroscopic measurements (17). Even though it is simple to compute the RF pulses and gradients with uniform k-space sampling in small number of interleaves, large number of interleaves (to the extent of one k-line per excitation) will make it inefficient in distributing RF powers. The segments at the periphery of k-space requires very low RF power, yet the demand of the RF peak power $B_{1\_max}$ for the center segment may well exceed the power limit of the RF coil (18). Sersa et al. (28) presented random walk trajectory in discrete k-space selected by simulated annealing algorithm to weight a selected number of pairs of most dominant Fourier coefficients for arbitrary shape ROI. The complexity of choosing the random walk trajectory makes a practical implementation difficult.

ASSESS pulses use a simple radial trajectory in k-space for excitation. The broad bandwidth is accomplished by inserting refocusing pulses to restrict the phase accumulation caused by the chemical shift to the duration of only a single k-space line. The radial k-space trajectory also minimizes the required $B_{1\_max}$ since the center of the k-space is traversed with a high sampling density. From the point spread function analysis for excitation k-space, the required $B_{1\_max}$ of the RF pulse, to generate a 90° nutation angle, is proportional to $$\sqrt{\text{area}(\text{ROI})}/(\text{FOE} \times N_{k\text{-}line})$$

with the radial k-space sampling, in contrast to $\text{area}(\text{ROI})/\text{FOE}^2$ for the rectilinear sampling (18). In fact, if the radial k-lines are replaced by simpler rectilinear klines for the hippocampal ROI selected in the second experiment, $B_{1\_max}$ during the RF weighting will increase from 890 Hz to 5000 Hz.

In addition to excitation, the principle of RF pulse concatenation to generate large nutation angles (7) has also been proposed for spatial selective inversion (20,29). The long pulse length used in this work (especially for ASSESS ($N_{k\text{-}line}$=9): EPL=66 ms) is largely spent on gradient rewinding before and after the RF weighting for each radial direction k-line segment. This can be reduced with higher performance gradient systems. Further reduction can be explored by increasing the gradient during the RF weighting, which also broadens the bandwidth at the cost of higher demands on $B_{1\_max}$. Shortening of RF pulses is crucial for spectroscopy measurements at higher magnetic fields, since those studies encounter shorter $T_2$ relaxation times and also require a broader bandwidth to cover all chemical shifts.

The use of OVS in addition to the 2D spatial excitation pulse was previously proposed for better localization (30). The excitation profile can also be improved by iterative numerical optimization (31) or the SLR algorithm (32,33). For measuring absolute metabolite concentrations, it will be easier to correct RF inhomogeneity effects in ASSESS by modulating the calculated RF with an accurate RF field map (34). Based on this approach, excitation through parallel transmitting coils (35,36) will potentially reduce the overall pulse length per excitation, making short echo time spectroscopy measurements possible.

In sum, while conventional single-voxel localization for MR spectroscopy is restricted to selecting only rectangular shaped regions of interest, the present invention provides methods such that the measurement of spectra from regions with arbitrary shape is realized. In practice, the complexity of tissues shapes of interest and the desire to maximize signal to noise while minimizing partial volume effects requires more sophisticated localization techniques. A group of spatially selective RF pulses are utilized by practicing the present invention for the measurement of spectra from regions with arbitrary shape based on using a radial trajectory in k-space. Utilizing a single k-line per excitation results in a broad spectroscopic bandwidth. However, spatial localization accuracy is compromised for nutation angles >10° because of the small-tip-angle approximation of the Bloch equations. By interleaving multiple radial k-lines per excitation with non-selective refocusing pulses, accurate localization can be achieved for nutation angles up to 90°, while simultaneously maintaining the spectral bandwidth.

The foregoing description of the exemplary embodiments of the invention has been presented only for the purposes of illustration and description and is not intended to be exhaustive or to limit the invention to the precise forms disclosed. Many modifications and variations are possible in light of the above teaching.

While there has been shown various embodiments of the present invention, it is to be understood that certain changes can be made in the form and arrangement of the elements of the apparatus and steps of the methods to practice the present invention as would be known to one skilled in the art without departing from the underlying scope of the invention as is particularly set forth in the Claims. For examples, while examples set forth above are related to practice the present invention for $N_{R\text{-}line}$=1, 5 and 9, the present invention can be practiced for other numbers as well. Furthermore, the embodiments described above are only intended to illustrate the principles of the present invention and are not intended to limit the claims to the disclosed elements.

LIST OF REFERENCES

1. Ordidge R J, Connelly A, Lohman J A B. Image-selected in vivo spectroscopy (ISIS)—a new technique for spatially selective NMR-spectroscopy. J Magn Reson 1986; 66(2): 283-294.
2. Frahm J, Merboldt K D, Hanicke W. Localized proton spectroscopy using stimulated echoes. J Magn Reson 1987; 72(3):502-508.
3. Bottomley P A. Spatial localization in NMR-spectroscopy in vivo. Ann New York Acad Sci 1987; 508:333-348.
4. Brown T R, Kincaid B M, Ugurbil K. NMR chemical-shift imaging in 3 Dimensions. Proc Natl Acad Sci USA 1982; 79(11):3523-3526.
5. Hetherington H P, Kim J H, Pan J W, Spencer D D. H-1 and P-31 spectroscopic imaging of epilepsy: Spectroscopic and histologic correlations. Epilepsia 2004; 45:17-23.
6. Pauly J, Nishimura D, Macovski A. A k-space analysis of small-tip-angle excitation. J Magn Reson 1989; 81(1):43-56.
7. Pauly J, Nishimura D, Macovski A. A linear class of large-tip-angle selective excitation pulses. J Magn Reson 1989; 82(3):571-587.
8. Hardy C J, Cline H E. Spatial localization in 2 dimensions using NMR designer pulses. J Magn Reson 1989; 82(3): 647-654.
9. Hardy C J, Bottomley P A. P-31 spectroscopic localization using pinwheel NMR excitation pulses. Magn Reson Med 1991; 17(2):315-327.
10. Nehrke K, Bornert P, Groen J, Smink J, Bock J C. On the performance and accuracy of 2D navigator pulses. Magn Reson Imag 1999; 17(8):1173-1181.
11. Rieseberg S, Frahm J, Finsterbusch F. Two-dimensional spatially-selective RF excitation pulses in echo-planar Imaging. Magn Reson Med 2002; 47(6):1186-1193.
12. Bornert P, Schaffter T. Curved slice imaging. Magn Reson Med 1996; 36(6):932-939.
13. Stenger V A, Boada F E, Noll D C. Three-dimensional tailored RF pulses for the eduction of susceptibility artifacts in T-2*-weighted functional MRI. Magn Reson Med 2000; 44(4):525-531.
14. Pat G T L, Pauly J M, Hu B S, Nishimura D G. One-shot spatially resolved velocity imaging. Magn Reson Med 1998; 40(4):603-613.
15. Davies N P, Jezzard P. Selective arterial spin Labeling (SASL): Perfusion territory mapping of selected feeding arteries tagged using two-dimensional radiofrequency pulses. Magn Reson Med 2003; 49(6):1133-1142.
16. Bornert P, Aldefeld B. On spatially selective RF excitation and its analogy with spiral MR image acquisition. Magn Reson Mater Phys Biol Med 1998; 7:166-178.
17. Qin Q, deGraaf R A, Does M D, Avison M J, Gore J C. 2D arbitrary shape excitation for spectroscopy measurement. Proceedings of the International Society for Magnetic Resonance in Medicine. Thirteenth Scientific Meeting and Exhibition, 2005: Miami Beach, USA. p 2764.
18. Qin Q, deGraaf R A, Does M D, Gore J C. Calculation of RF peak power for 2D arbitrary shape excitation in MRI.

Proceedings of 27th Annual International Conference of the IEEE Engineering in Medicine and Biology Society (EMBS). 2005: Shanghai, China. p 1334.
19. Hardy C J, Cline H E, Bottomley P A. Correcting for nonuniform k-space sampling in 2-dimensional NMR selective excitation. J Magn Reson 1990; 87(3):639-645.
20. Wright G A, Pauly J M, Macovski A. Decreasing B0 sensitivity of long RF pulses. Proceedings of the Society of Magnetic Resonance in Medicine. Twelfth Annual Meeting, 1993: New York, USA. p 423 (NEW).
21. Sussman M S, Pauly J M, Wright G A. Design of practical T-2-selective RF excitation (TELEX) pulses. Magn Reson Med 1998; 40(6):890-899.
22. Hennig J, Nauerth A, Friedburg H. RARE imaging—a fast imaging method for clinical MRI. Magn Reson Med 1986; 3(6):823-833.
23. Haase A, Frahm J, Hanicke W, Matthaei D. $^1$H NMR chemical shift selective (CHESS) imaging. Phys Med Biol 1985; 30:341-344.
24. Mao J, Mareci T H, Scott K N, Andrew E R. Selective inversion radiofrequency pulses by optimal control. J Magn Reson 1986; 70:310-318.
25. Gruetter R. Automatic, localized in vivo adjustment of all first- and second-order shim coils. Magn Reson Med 1993; 29:804-811.
26. Rim C Y, Ra J B, Cho Z H. Radial scanning technique for volume selective P-31 spectroscopy. Magn Reson Med 1992; 24(1):100-108.
27. Panych L P, Oshio K. Selection of high-definition 2D virtual profiles with multiple RF pulse excitations along interleaved echo-planar k-space trajectories. Magn Reson Med 1999; 41 (2):224-229.
28. Sersa I, Macura S. Broad-band NMR with a high spectral and spatial resolution. Appl Magn Reson 2002; 22(2):277-290.
29. Pruessmann K P, Golay X, Stuber M, Scheidegger M B, Boesiger P. RF pulse concatenation for spatially selective inversion. J Magn Reson 2000; 146(1):58-65.
30. St Lawrence K, Lee T Y, Henkelman M. Spatial localization combining projection presaturation with a two-dimensional excitation pulse. Magn Reson Med 1998; 40(6):944-947.
31. Yip C Y, Fessler J A, Douglas C N. Iterative RF pulse design for multidimensional, small-tip-angle selective excitation. Magn Reson Med 2005; 54(4):908-917.
32. Shinnar M, Eleff S, Subramanian H, Leigh J S. The synthesis of pulse sequences yielding arbitrary magnetization vectors. Magn Reson Med 1989; 12(1):74-80.
33. Pauly J, Leroux P, Nishimura D, Macovski A. Parameter relations for the Shinnar-Leroux selective excitation pulse design algorithm. IEEE Trans Med Imaging 1991; 10(1): 53-65.
34. Wang J H, Qiu M L, Yang Q X, Smith M B, Constable R T. Measurement and correction of transmitter and receiver induced nonuniformities in vivo. Magn Reson Med 2005; 53(2):408-417.
35. Zhu Y D. Parallel excitation with an array of transmit coils. Magn Reson Med 2004; 51(4):775-784.
36. Katscher U, Bornert P, Leussler C, van den Brink JS. Transmit SENSE. Magn Reson Med 2003; 49(1):144-150.

What is claimed is:

1. A method for NMR measurements of an arbitrarily shaped region of interest of a living subject, comprising the steps of:
   (a) applying a broad bandwidth of RF pulses to the arbitrarily shaped region of interest to obtain a corresponding spectrum, wherein substantially entire range of chemical shifts in the spectrum is excited from the arbitrarily shaped region of interest;
   (b) interleaving a plurality of radial k-lines in radial k-space per excitation with non-selective refocusing pulses; and
   (c) obtaining spatial localization for the spectrum of the arbitrarily shaped region of interest,
   wherein the plurality of radial k-lines in radial k-space has a total number $N_{k\text{-}line}$.

2. The method of claim 1, wherein the total number $N_{k\text{-}line}$ is an odd number.

3. The method of claim 1, wherein the total number $N_{k\text{-}line}=1$, 5 or 9.

4. The method of claim 1, wherein the arbitrarily shaped region of interest is two dimensional.

5. The method of claim 1, wherein the arbitrarily shaped region of interest is three dimensional.

6. A system for NMR measurements of an arbitrarily shaped region of interest of a living subject, comprising:
   (a) means for applying a broad bandwidth of RF pulses to the arbitrarily shaped region of interest to obtain a corresponding spectrum, wherein substantially entire range of chemical shifts in the spectrum is excited from the arbitrarily shaped region of interest;
   (b) means for interleaving a plurality of radial k-lines in radial k-space per excitation with non-selective refocusing pulses; and
   (c) means for obtaining spatial localization for the spectrum of the arbitrarily shaped region of interest,
   wherein the plurality of radial k-lines in radial k-space has a total number $N_{k\text{-}line}$.

7. The system of claim 6, wherein the total number $N_{k\text{-}line}=1$, 5 or 9.

8. The system of claim 6, wherein the total number $N_{k\text{-}line}$ is an odd number.

9. The system of claim 6, further comprising means for generating a broad bandwidth of RF pulses.

10. A method for NMR measurements of an arbitrarily shaped region of interest of a living subject, comprising the steps of:
    (a) applying RF pulses with a bandwidth to the arbitrarily shaped region of interest to obtain a corresponding spectrum with one or more excitations;
    (b) interleaving a plurality of radial k-lines in radial k-space per excitation with one or more non-selective refocusing pulses; and
    (c) obtaining spatial localization for the spectrum of the arbitrarily shaped region of interest,
    wherein the bandwidth of the RF pulses is sufficiently broad to allow a substantially entire range of chemical shifts in the spectrum to be excited from the arbitrarily shaped region of interest.

11. The method of claim 10, wherein the frequency of the RF pulses is in the range of 10 Hz to 100 GHz.

12. The method of claim 11, wherein the bandwidth of one or more refocusing pulses is in the range of 10 Hz to 100 GHz but the frequency of one or more refocusing pulses is different from that of corresponding RF pulses.

13. A method for NMR measurements of an arbitrarily shaped region of interest of a living subject, comprising the steps of:
    (a) applying RF pulses with a bandwidth to the arbitrarily shaped region of interest to obtain a corresponding spectrum with one or more excitations;

(b) interleaving a plurality of radial k-lines in radial k-space per excitation with one or more non-selective refocusing pulses; and (c) obtaining spatial localization for the spectrum of the arbitrarily shaped region of interest, wherein the plurality of radial k-lines in radial k-space has a total number $N_{k\text{-}line}$.

14. The method of claim 13, wherein the total number $N_{k\text{-}line}$ is an odd number.

15. The method of claim 13, wherein the total number $N_{k\text{-}line}=1$, 5 or 9.

16. The method of claim 13, wherein the arbitrarily shaped region of interest is two dimensional.

17. The method of claim 13, wherein the arbitrarily shaped region of interest is three dimensional.

* * * * *